United States Patent [19]
Azadet

[11] Patent Number: 5,983,254
[45] Date of Patent: Nov. 9, 1999

[54] ZERO-LATENCY PIPELINE ARCHITECTURE FOR DIGITAL FILTERS

[75] Inventor: Kameran Azadet, Middletown, N.J.

[73] Assignee: Lucent Technologies Inc., Murray Hill, N.J.

[21] Appl. No.: 08/713,687

[22] Filed: Sep. 17, 1996

[51] Int. Cl.⁶ .................................................. G06F 17/10
[52] U.S. Cl. .................... 708/300; 708/301; 708/319; 708/322
[58] Field of Search ..................... 364/724.011, 724.012, 364/724.16, 724.17, 724.19, 724.2, 726.04, 726.05, 728.06; 708/300, 301, 319, 320, 322, 323, 406, 407, 425

[56] References Cited

U.S. PATENT DOCUMENTS

| | | | |
|---|---|---|---|
| 4,791,390 | 12/1988 | Harris et al. | 333/166 |
| 5,193,070 | 3/1993 | Abiko et al. | 364/724.16 |
| 5,255,215 | 10/1993 | Sakata et al. | 364/724.19 |
| 5,432,723 | 7/1995 | Chen et al. | 364/724.011 |
| 5,450,339 | 9/1995 | Chester et al. | 364/724.19 |
| 5,691,929 | 11/1997 | Sun | 364/724.011 |
| 5,717,619 | 2/1998 | Spurbeck et al. | 364/724.16 |

OTHER PUBLICATIONS

C. Caraiscos, "Low–Latency Bit–Parallel Systolic VLSI Implementation of FIR Digital Filters," *IEEE Transactions on Circuits and Systems—II: Analog and Digital Signal Processing,* vol. 43, No. 7, Jul. 1996, pp. 529–534.

*Primary Examiner*—Emmanuel L. Moise

[57] ABSTRACT

In a digital filter, data is received through an input path, and data in the filter is transported to an output through an output path. At least one delay element is disposed on the input path, and at least another delay element is disposed on the output path. The specific positions of the delay elements on the respective paths are selected to yield an optimal combination of filter parameters including the maximum computation delay, cost, and power consumption of the filter.

26 Claims, 7 Drawing Sheets

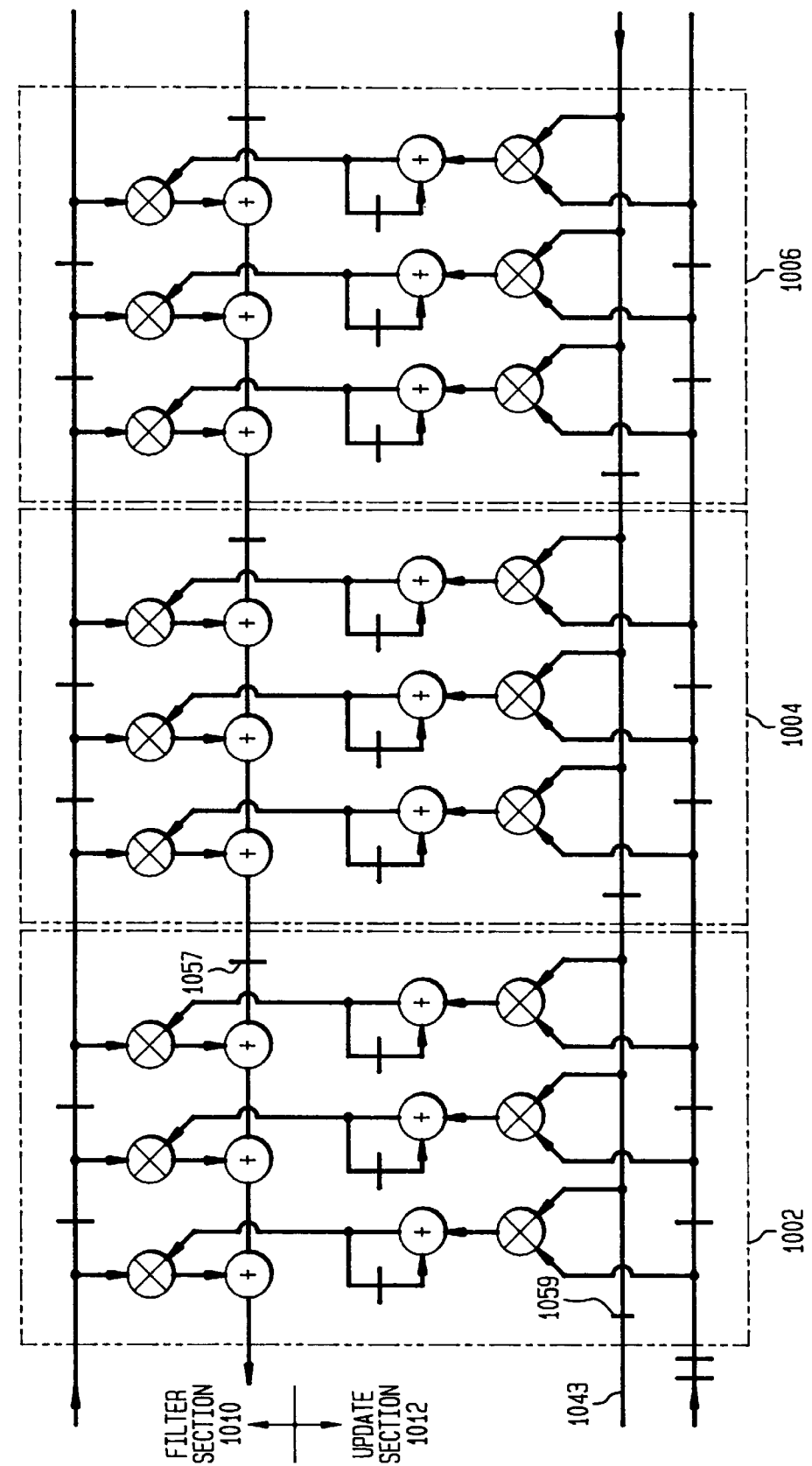

5,983,254

ZERO-LATENCY PIPELINE ARCHITECTURE FOR DIGITAL FILTERS

FIELD OF THE INVENTION

The invention relates to digital filter designs, and more particularly to such designs conducive to efficient filter layout and processing.

BACKGROUND OF THE INVENTION

Digital filters are commonly employed in signal processing applications. FIG. 1 shows a finite impulse response (FIR) filter in a well-known direct form. As shown in FIG. 1, filter 100 comprises multipliers 103a through 103e having five taps with filter weights or tap coefficients, $w_0$ through $w_4$, respectively. These filter weights represent multiplicands to be multiplied by input data traversing input path 101. In accordance with the direct form, delay elements 105a through 105d, which may be shift registers, are inserted on input path 101 and each disposed between two multipliers. In addition, adders 107a through 107d are disposed on output path 111 and each connected at the output of a multiplier. With such an arrangement, the z-transform of the output of filter 100, $Y_{100}(z)$, is:

$$Y_{100}(z) = w_0 + w_1 z^{-1} + w_2 z^{-2} + w_3 z^{-3} + w_4 z^{-4}. \qquad (1)$$

In high-speed signal processing applications, the direct form filter is not desirable in that its critical path, corresponding to the maximum computation delay in generating an output, includes many computational elements contributing to the delay. For example, the critical path of filter 100 includes five computational elements, namely, multiplier 103e, and adders 107a–d on output path 111. Furthermore, this computation delay increases with the number of taps in the direct form filter.

However, use of digital filters in a transpose form overcomes the above computation delay problem. FIG. 2 shows FIR filter 200 in the transpose form. The z-transform of the output of filter 200, $Y_{200}(z)$, is:

$$Y_{200}(z) = w_0 + w_1 z^{-1} + w_2 z^{-2} + w_3 z^{-3} + w_4 z^{-4}. \qquad (2)$$

By comparing expression (2) with expression (1), one realizes that filter 200 has the same transfer function as filter 100. However, unlike filter 100, no delay element is disposed on input path 201 in filter 200. Rather, in accordance with the transpose form, delay elements 205a through 205d are disposed on output path 211 and each inserted between multiplier/adder pairs. This being so, the critical path in filter 200 includes a multiplier and an adder, resulting in the maximum computation delay incurred by a multiplication and an addition. Furthermore, such computation delay does not depend on the length, or the number of taps, of filter 200.

Nonetheless, one of the drawbacks of a transpose form filter is that the multipliers in the filter present a substantial capacitive load at the filter input, resulting in a significant input delay and a substantial level of power consumption. Power consumption becomes a major issue when it affects the choice of packaging for the filters, and the packaging becomes expensive if it is required to dissipate heat efficiently. Furthermore, the capacitive load increases with the number of filter taps, thus requiring use of buffers to provide an amount of charge proportional to the number of taps.

Another drawback of a transpose form filter is that because the delay elements are disposed on the output path of the filter, these delay elements, typically shift registers, are relatively large, with respect to those in a direct form filter, to accommodate the relatively long bit strings representing sums of products on the output path. Such large delay elements are relatively expensive, and contribute more power consumption in the filter.

Another type of FIR filter employs the well-known systolic architecture. Representative W1 and W2 systolic FIR filters are shown in FIGS. 3 and 4, respectively. Among other things, systolic filters are desirable in that they are arranged in a pipeline (or modular) form and comprise a number of structurally identical modules. Each module in the respective filter is shown in FIGS. 3 and 4 by a dashed box enclosing the module. Since the modules are independent of one another, the layouts of the W1 and W2 systolic filters simply involve an assembly of identical predefined modules.

Like the transpose form filters, the computation delay of the systolic filters is independent of the number of filter taps. However, additional delay elements have been inserted in the systolic filters to reduce both the computation delay and input capacitive load. The undesirable effect occasioned by these additional delay elements is apparent from examining the z-transforms of the respective systolic filter outputs. The z-transform of the W1 systolic filter output, $Y_{W1}$, is:

$$Y_{w1}(z) = z^{-1}(w_0 + w_1 z^{-2} + w_2 z^{-4} + w_3 z^{-6} + w_4 z^{-8}). \qquad (3)$$

From expression (3), the factor $z^{-1}$ indicates that the latency of the W1 systolic filter output equals a clock cycle. That is, it takes a clock cycle after the data is input to the filter to obtain the corresponding filter output. Although the latency of a clock cycle may be tolerable, the remaining expression, $w_0 + w_1 z^{-2} + w_2 z^{-4} + w_3 z^{-6} + w_4 z^{-8}$, which is a function of $z^{-2}$, presents a more challenging problem in a high-speed signal processing application. In order to maintain the input data bit rate, the clock rate at which the filter operates must be double the input rate. This is challenging because the input rate is already very high in the high-speed application.

Turning to the W2 systolic filter of FIG. 4, the z-transform of the filter output, $Y_{W2}$, is:

$$Y_{W2}(z) = z^{-5}(w_0 + w_1 z^{-1} + w_2 z^{-2} + w_3 z^{-3} + w_4 z^{-4}). \qquad (4)$$

From expression (4), the factor $z^{-5}$ indicates that the latency of the filter output equals five clock cycles. In general, the latency of a W2 systolic filter output equals N clock cycles, where N is the number of filter taps. In many signal processing applications, such large latency is simply unacceptable.

Accordingly, there exists a need for a digital filter design characterized by a short computation delay and latency, low power consumption, and an inexpensive and uncomplicated construction.

SUMMARY OF THE INVENTION

In the inventive digital filter, the number of delay elements in the filter does not exceed the number of filter taps therein. The inventive filter has an input path for transporting input data to the filter, and an output path for transporting data in the filter to an output thereof. In accordance with the invention, at least one of the delay elements is disposed on the input path, and at least another one of the delay elements is disposed on the output path. The specific positions of the delay elements on the input and output paths are selected to yield an optimal combination of filter parameters including the maximum computation delay, cost, and power consumption of the filter. In addition, the inventive filter achieves zero latency, and is readily realizable in a pipeline form, thus facilitating the layout thereof.

BRIEF DESCRIPTION OF THE DRAWING

In the drawing,

FIG. 10 illustrates an adaptive digital filter in accordance with the invention;

DETAILED DESCRIPTION

Figure 1:
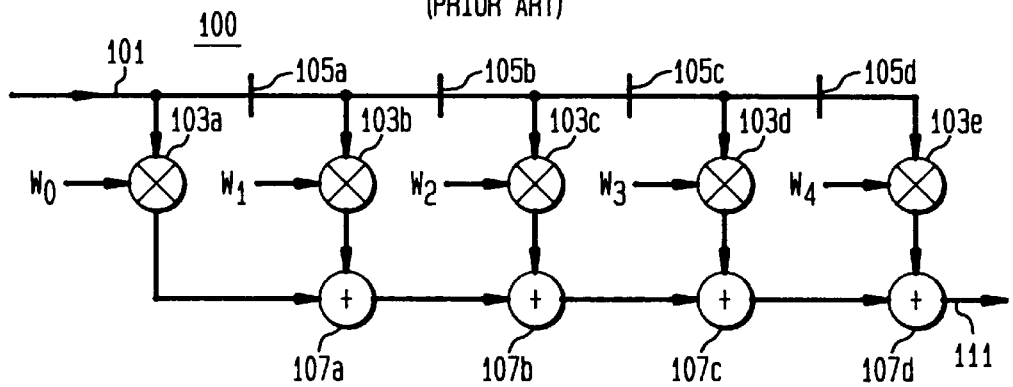
FIG. 1 illustrates a prior art FIR digital filter in a direct form.
Figure 2:
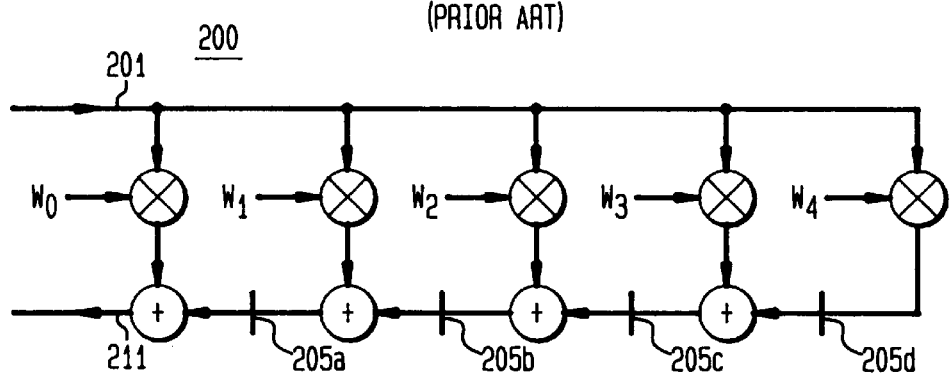
FIG. 2 illustrates a prior art FIR digital filter in a transpose form.
Figure 3:
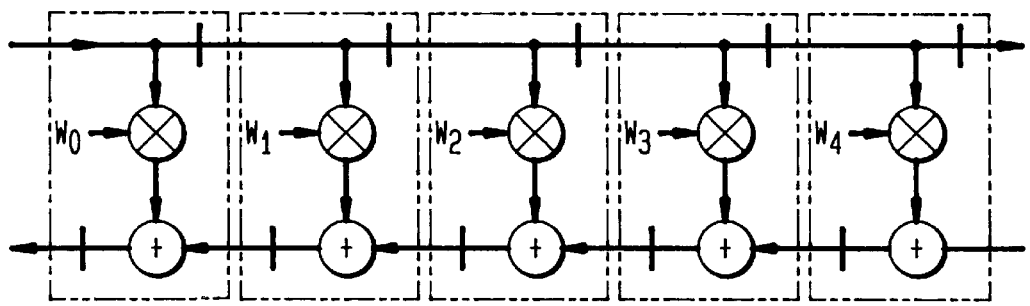
FIG. 3 illustrates a prior art W1 systolic digital filter.
Figure 4:
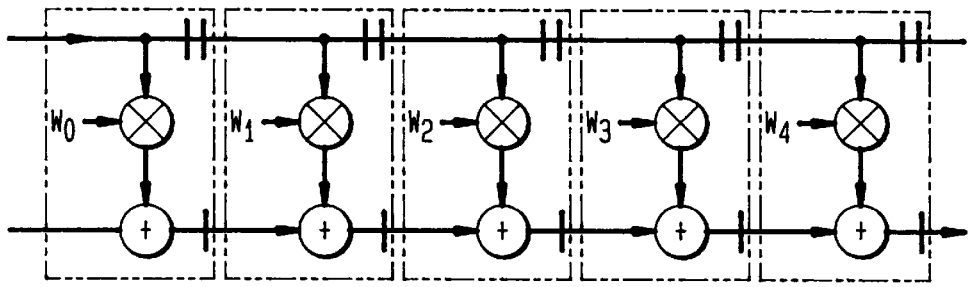
FIG. 4 illustrates a prior art W2 systolic digital filter.
Figure 5:
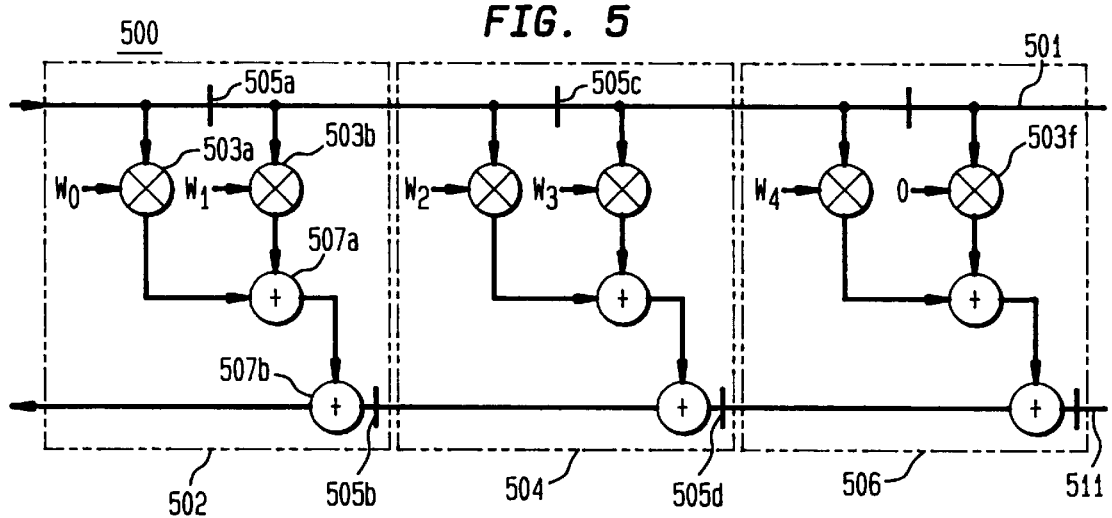
FIG. 5 illustrates an FIR digital filter having a first number of modules in accordance with the invention.

FIG. 5 illustrates FIR filter 500 embodying the principles of the invention. In accordance with the invention, filter 500 is arranged in a pipeline form and comprises a plurality of structurally identical modules such as modules 502, 504 and 506. Advantageously, the layout of the inventive filter simply involves an assembly of identical predefined modules.

For example, module 502 provides two taps at multipliers 503a and 503b. For that reason, module 502 is herein referred to as a "second order" module. The same number of delay elements as the number of the taps (i.e., two) are included in module 502. Specifically, delay element 505a is disposed on input path 501 and between multipliers 503a and 503b. Adder 507a receives two products from the respective multipliers, and provides a sum of these two products to adder 507b. The latter is disposed alongside delay element 505b on output path 511 in module 502. The other modules in filter 500 are arranged similarly to module 502.

In this particular illustrative embodiment, filter 500 is configured to be an FIR filter having five taps. Since each module in this instance provides two taps, three modules (i.e., 502, 504 and 506) are needed to constitute filter 500. However, modules 502, 504 and 506 together provide more than five taps. As such, the filter weight at multiplier 503f in module 506 is set to zero, resulting in five effective taps. The filter weights for these five effective taps are $w_0$ through $W_4$, respectively.

With the above arrangement, the z-transform of the output of filter 500, $Y_{500}(z)$, can be expressed as follows:

$$Y_{500}(z)=[w_0+w_1z^{-1}]+z^{-2}[w_2+w_3z^{-1}]+z^{-4}[w_4+0z^{-1}], \quad (5)$$

where the first term $[w_0+w_1z^{-1}]$ corresponds to module 502; the second term $z^{-2}[w_2+w_3z^{-1}]$ corresponds to module 504, and the factor $z^{-2}$ is attributed to delay element 505a on input path 501 and delay element 505b on output path 511 in the module (i.e., module 502) preceding thereto; and the third term $z^{-4}[w_4+0z^{-1}]$ corresponds to module 506, and the factor $z^{-4}$ is attributed to delay elements 505a and 505c on input path 501 and delay elements 505b and 505d on output path 511 in the modules (i.e., modules 502 and 504) preceding thereto.

Expression (5) can be rewritten as follows:

$$Y_{500}(z)=w_0+w_1z^{-1}+w_2z^{-2}+w_3z^{-3}+w_4z^{-4}. \quad (6)$$

By comparing expression (6) with expressions (1) and (2) above, one realizes that filter 500 has the same transfer function as direct form filter 100 and transpose form filter 200 previously described.

However, filter 500 has advantages over individual prior art filters. For example, unlike prior art systolic filters, no additional delay has been introduced into filter 500. As a result, filter 500 affords zero latency. In addition, because of the delay elements (e.g., delay element 505a) disposed on input path 501, the multipliers in filter 500 do not present a significant input capacitive load as in the case of transpose form filter 200. Moreover, since only some of the delay elements are disposed on output path 511, the number of large shift registers needed on the output path of filter 500 is accordingly smaller, with respect to filter 200. With fewer large shift registers required in filter 500, the cost and power consumption of filter 500 are accordingly less.

The critical path of filter 500, corresponding to the maximum computation delay, includes a multiplier (e.g., multiplier 503a) and two adders (e.g., adders 507a and 507b). It is much shorter than the critical path of direct form filter 100, which includes a multiplier and all of the adders (i.e., four) in filter 100. However, the critical path of filter 500 is not as short as that of filter 200, which includes a multiplier and an adder. That is, the difference between the maximum computation delay of filter 500 and that of filter 300 is the time required for an extra addition, which is in most cases insignificant.

Figure 6:
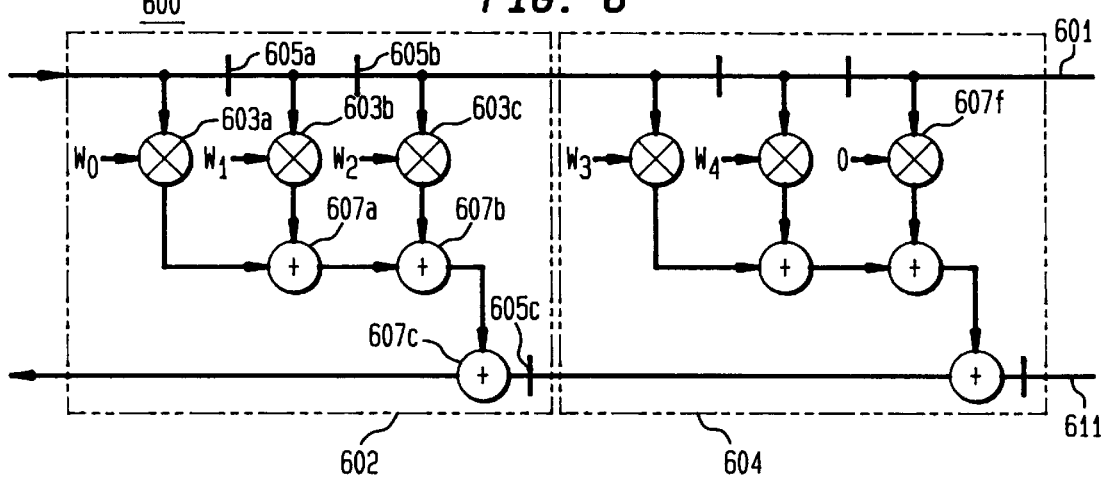
FIG. 6 illustrates an FIR digital filter having a second number of modules in accordance with the invention.

FIG. 6 illustrates FIR filter 600 in accordance with the invention. As shown in FIG. 6, filter 600 is advantageously configured in a pipeline form, and comprises modules 602 and 604 which are structurally identical.

For example, module 604, which is a third order module, provides three taps at multipliers 603a, 603b and 603c, respectively. The same number of delay elements as the number of taps are included in module 604. Specifically, delay elements 605a and 605b are disposed on input path 601, and delay element 605c is disposed on output path 611. Delay element 605a is inserted between multipliers 603a and 603b. Delay element 605b is inserted between multipliers 603b and 603c. Adder 607a receives products generated by respective multipliers 603a and 603b, and provides a sum of these two products to adder 607b. The latter receives the sum from adder 607a and a product generated by multiplier 603c, and provides the resulting sum to adder 607c, which is disposed on output path 611 alongside delay element 605c. Module 604 is arranged similarly to module 602.

The filter weight at multiplier 607f is set to zero, thereby rendering five effective taps in filter 600. The filter weights for these five effective taps are $w_0$ through $w_4$, respectively. With the above filter arrangement, the z-transform of the output of filter 600, $Y_{600}(z)$, can be expressed as follows:

$$Y_{600}(z)=[w_0+w_1z^{-1}+w_2z^{-2}]+z^{-3}[w_3+w_4z^{-1}+0z^{-2}], \quad (7)$$

where the first term $[w_0+w_1z^{-1}+w_2z^{-2}]$ corresponds to module 602; and the second term $z^{-3}[w_3+w_4z^{-1}+0z^{-2}]$ corresponds to module 604, and the factor $z^{-3}$ is attributed to delay elements 605*a* and 605*b* on input path 601 and delay element 605*c* on output path 611 in the module (i.e., module 602) preceding thereto.

Expression (7) can be rewritten as follows:

$$Y_{600}(z) = w_0 + w_1z^{-1} + w_2z^{-2} + w_3z^{-3} + w_4z^{-4}. \qquad (8)$$

By comparing expression (8) with expression (6) above, one realizes that filter 600 has the same transfer function as filter 500, which is functionally equivalent to direct form filter 100 and transpose form filter 200 previously described. However, by comparing the structures of filter 500 of FIG. 5 and filter 600 of FIG. 6, although they both have the same number of delay elements, one appreciates that with respect to filter 500, fewer delay elements are disposed on the output path of filter 600. As a result, fewer large shift registers are required on the output path of filter 600, thus further reducing the cost and power consumption of the filter.

The critical path of filter 600, corresponding to the maximum computation delay, includes a multiplier (e.g., multiplier 603*a*) and three adders (e.g., adders 607*a*, 607*b* and 607*c*). It is not as short as the critical path of filter 500, which includes a multiplier and two adders. That is, the difference between the maximum computation delay of filter 600 and that of filter 500 is the time required for another extra addition.

Figure 7:
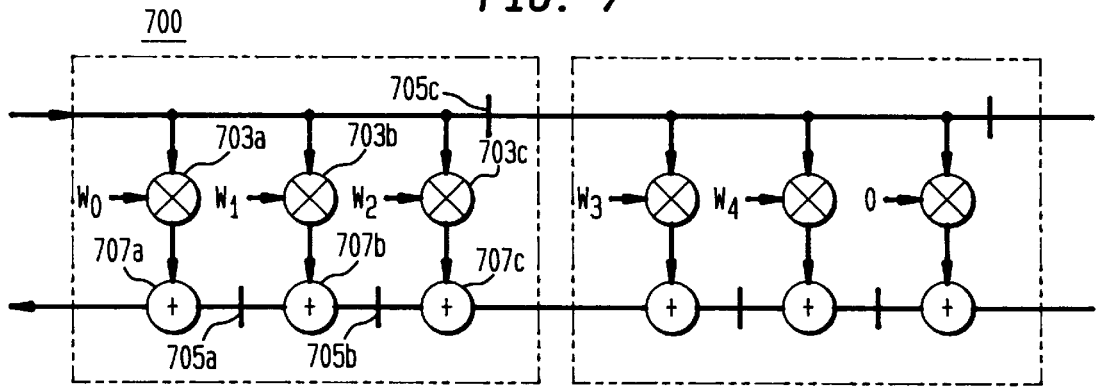
FIG. 7 illustrates an FIR digital filter having alternative modules to the ones in the filter of FIG. 6.

FIG. 7 shows filter 700 comprising alternative third order modules in accordance with the invention. For example, module 702 comprises multipliers 703*a* through 703*c*, delay elements 705*a* through 705*c*, and adders 707*a* through 707*c*. It can be shown that filter 700 is functionally equivalent to filter 600 in that they have identical output z-transforms.

It should be noted at this point that each module in filters 600 and 700 assumes a hybrid form between the direct form and transpose form, and thus possesses a combination of characteristics attributable to the two forms. However, unlike the modules in filter 600, the modules in filter 700 each have more delay elements on the output path than the input path. Thus, each module of filter 700 takes after a transpose form more than a direct form. On the other hand, each module of filter 600 takes after a direct form more than a transpose form. As a result, filter 700 affords more of the advantages associated with a transpose form filter such as filter 200. For example, filter 700 has a critical path including a multiplier (e.g., multiplier 703*d*) and two adders (e.g., adders 707*c* and 707*d*) which is shorter than that of filter 600, which is more like direct form filter 100. On the other hand, filter 600, affording more of the advantages associated with the direct form filter, requires fewer large shift registers on the output path than filter 700. For that reason, filter 600 is preferred to filter 700 if the requirement of the maximum computation delay allows an extra addition. However, if the maximum computation delay is critical, filter 500 is preferred to filter 700 as the maximum computation delays of the filters being equal, fewer delay elements on the output path and thus fewer large shift registers are needed in filter 500.

Figure 8:
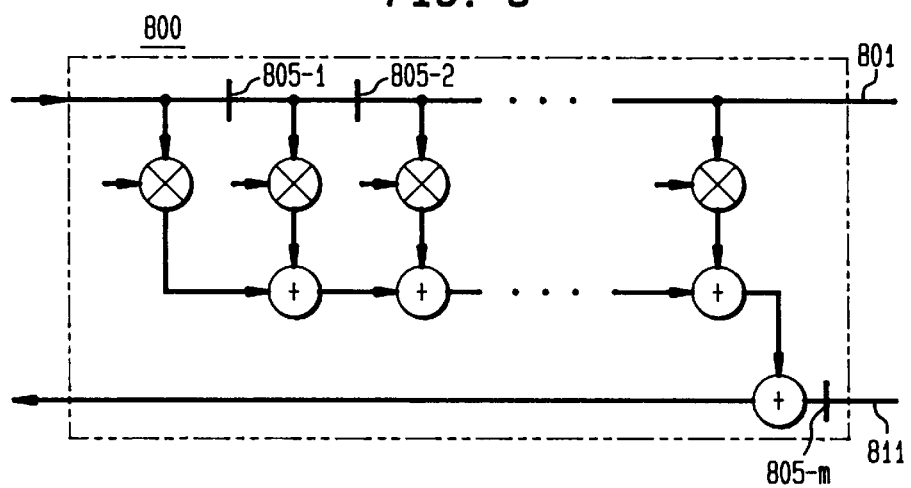
FIG. 8 illustrates a filter module in accordance with the invention.

Based on the disclosure heretofore, an $m^{th}$ order module in accordance with the invention is readily devised by disposing the m delay elements in the filter on the input and output paths of the filter in a selected pattern, where m>1. The actual pattern selected depends upon the filter requirements, such as the maximum allowable computation delay, cost, power consumption, etc. For example, if the maximum computation delay is not as critical as other requirements, one may opt for an $m^{th}$ order module illustrated in FIG. 8. As illustrated, $m^{th}$ order module 800 has m delay elements denoted 805-1 through 805-m. Only one delay element, namely, 805-m, is disposed on output path 811 while all the remaining delay elements are disposed on input path 801, thereby minimizing the number of large shift registers required on the output path, and thus the cost and power consumption of the filter. In fact, module 602 of FIG. 6 is one such module, where m=3.

The foregoing merely illustrates the principles of the invention. Thus, it will be appreciated that a person skilled in the art may devise numerous other filter arrangements which embody the principles of the invention and are thus within its spirit and scope.

For example, the above principles applied to the design of the filter modules generally apply to the design of a digital filter. That is, one can design an optimal filter by inserting the delay elements of the filter in selected positions on the input and output paths thereof to realize the best combination of advantages associated with direct form and transpose form filters. Of course, on one extreme, if each delay element in the filter is disposed on the input path, the filter becomes a direct form filter. On the other extreme, if each delay element is disposed on the output path, the filter becomes a transpose form filter.

In addition, the principles of the invention can be applied to the design of an adaptive digital filter where the filter weights are updated as a function of an error input. In general, the $k^{th}$ filter weight ($w_k$) of an adaptive filter having N taps is updated pursuant to the following expression, where $0 \leq k \leq N-1$:

$$w_k(n+1) = w_k(n) + \mu[e(n-\Delta)]x_k(n-\Delta), \qquad (9)$$

where $w_k(n)$ represents the value of the $k^{th}$ filter weight during the current $n^{th}$ clock cycle, and $w_k(n+1)$ represents the value of the $k^{th}$ filter weight for the upcoming clock cycle. The parameter $\mu$ represents the value of a step size in accordance with a standard steepest descent algorithm for obtaining the optimal value for $w_k$. The term $e(n-\Delta)$ represents an error value which takes $\Delta$ clock cycles to compute, and the term $x_k(n-\Delta)$ represents a value of the filter input to a multiplier, associated with $w_k$, $\Delta$ clock cycles ago.

Figure 9:
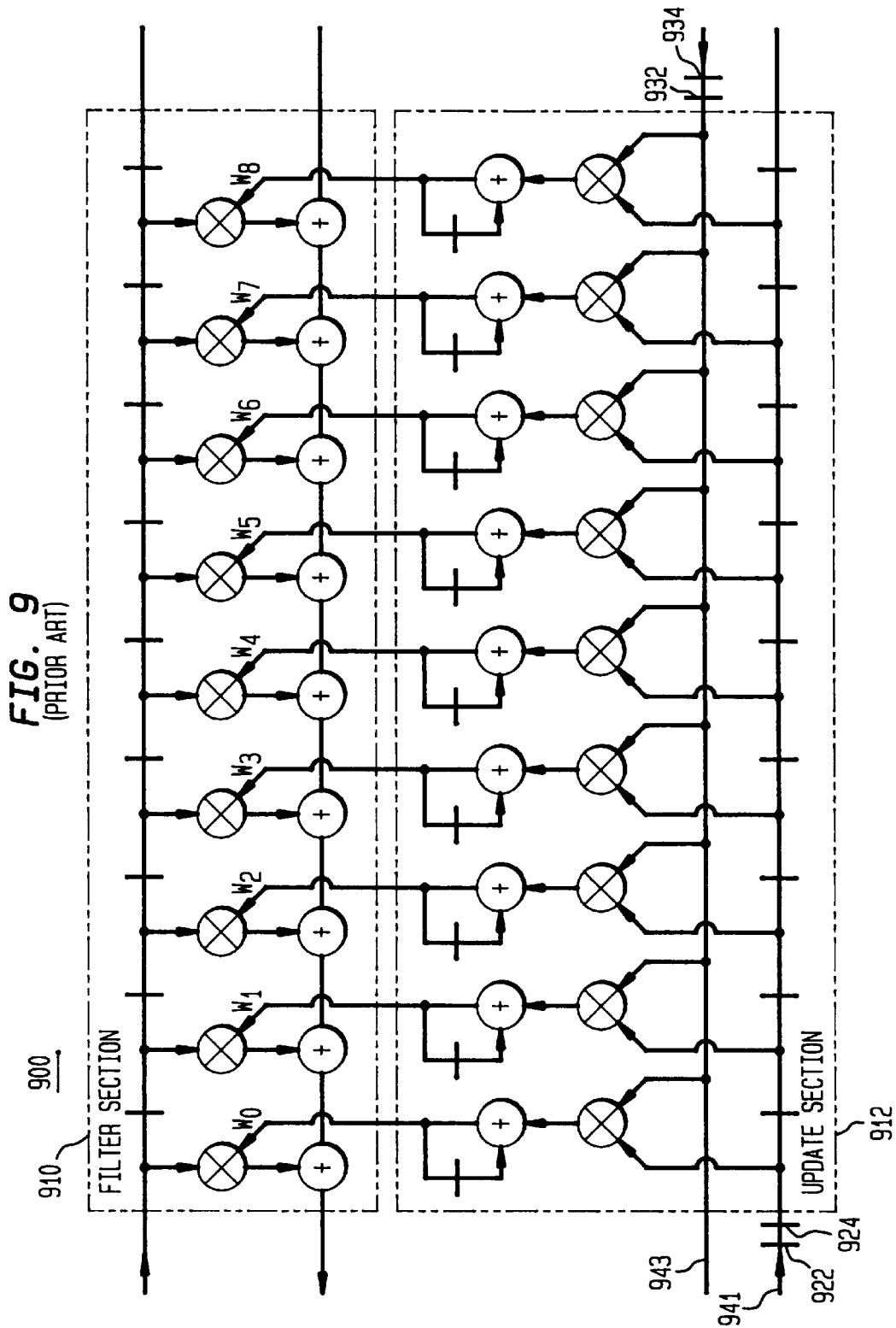
FIG. 9 illustrates a prior art adaptive digital filter.

FIG. 9 shows prior art adaptive digital filter 900. As shown in FIG. 9, filter 900 comprises filter section 910 which assumes a direct form and has nine taps. The filter weights at these taps are denoted $w_0$ through $w_8$, respectively, and are each updated in update section 912 pursuant to expression (9), where illustratively $\Delta=2$. In accordance with expression (9), a set of $\Delta$ (i.e. two) delay elements, numerically denoted 922 and 924, are disposed on input signal path 941 for providing to update section 912 an input corresponding to $x_k(n-\Delta)$. Another set of $\Delta=2$ delay elements, numerically denoted 932 and 934, are disposed on error signal path 943 for providing to update section 912 an input corresponding to $\mu[e(n-\Delta)]$.

FIG. 10 illustrates adaptive digital filter 1000 in accordance with the invention. It can be shown that filter 1000 is functionally equivalent to prior art filter 900. However, filter 1000 is an improvement over the prior art filter.

Filter 1000 is arranged in a pipeline form and comprises three structurally identical modules, numerically denoted 1002, 1004 and 1006. Unlike filter section 910 of filter 900 wherein each delay element is disposed on the same path (i.e., the input path) in the section, at least one delay element (e.g., delay element 1057) in each module in filter section 1010 of filter 1000 is disposed on a different path (i.e., the output path), in accordance with the invention. The principles of the invention are further applied to the design of update section 1012. Unlike update section 912 of filter 900 wherein each delay element is disposed on path 941, at least one delay element (e.g., delay element 1059) in each module in update section 1012 is disposed on a different path, namely, error signal path 1043, in accordance with the invention.

Figure 12:
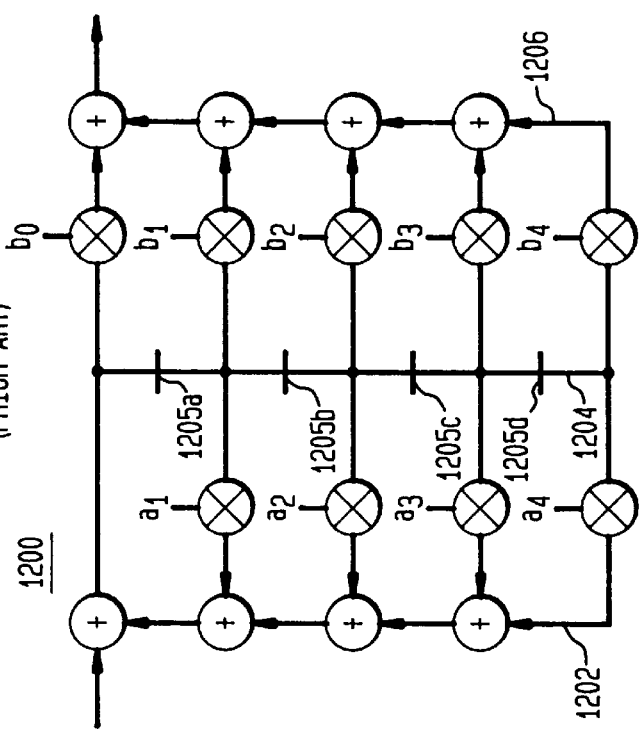
FIGS. 11 and 12 respectively illustrate two prior art infinite impulse response (IIR) filters.
Figure 11:
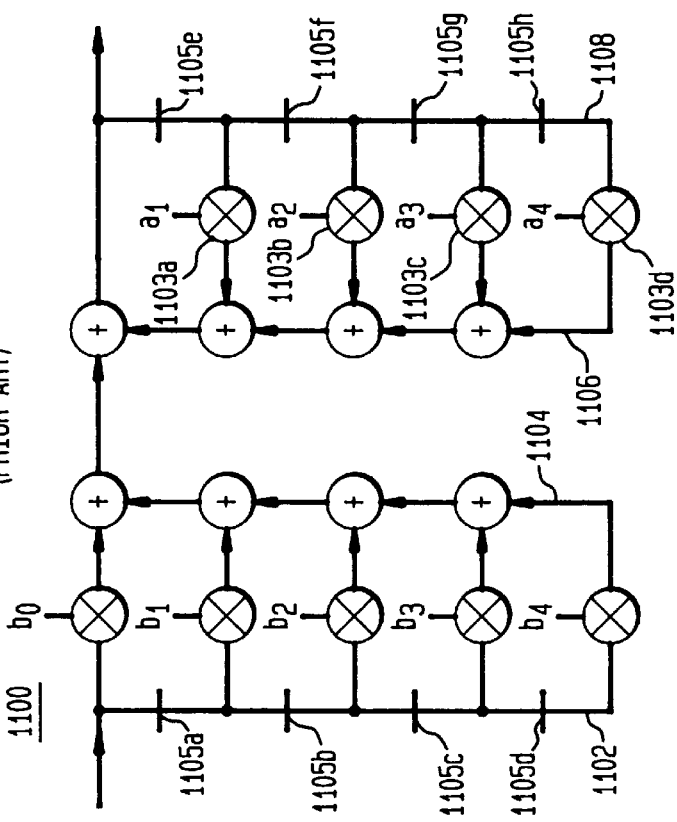

Finally, the principles of the invention can also be applied to the design of an infinite impulse response (IIR) filter. FIGS. 11 and 12 illustrate prior art IIR filters 1100 and 1200 in direct forms I and II, respectively. As shown in FIGS. 11 and 12, filters 1100 and 1200 each include nine multipliers having respective filter weight $a_1$ through $a_4$ and $b_0$ through $b_4$ at the taps thereof.

Filter 1100 has delay elements 1105a through 1105d disposed on input path 1102, and delay elements 1105e through 1105h disposed on path 1108, which is also an input (albeit feedback) path with respect to multipliers 1103a through 1103d. It should be noted that, like direct form FIR filter 100, filter 1100 has no delay element on output path 1104 or 1106.

Filter 1200 has delay elements 1205a through 1205d disposed on input path 1204. It should also be noted that, like filter 100, filter 1200 has no delay element on output path 1202 or 1206. With the above filter arrangements, the z-transforms of the outputs of filters 1100 and 1200 can both be expressed as:

$$Y_{IIR}(z) = \frac{\sum_{j=0}^{4} b_j z^{-j}}{1 - \sum_{j=1}^{4} a_j z^{-j}}. \quad (10)$$

Figure 14:
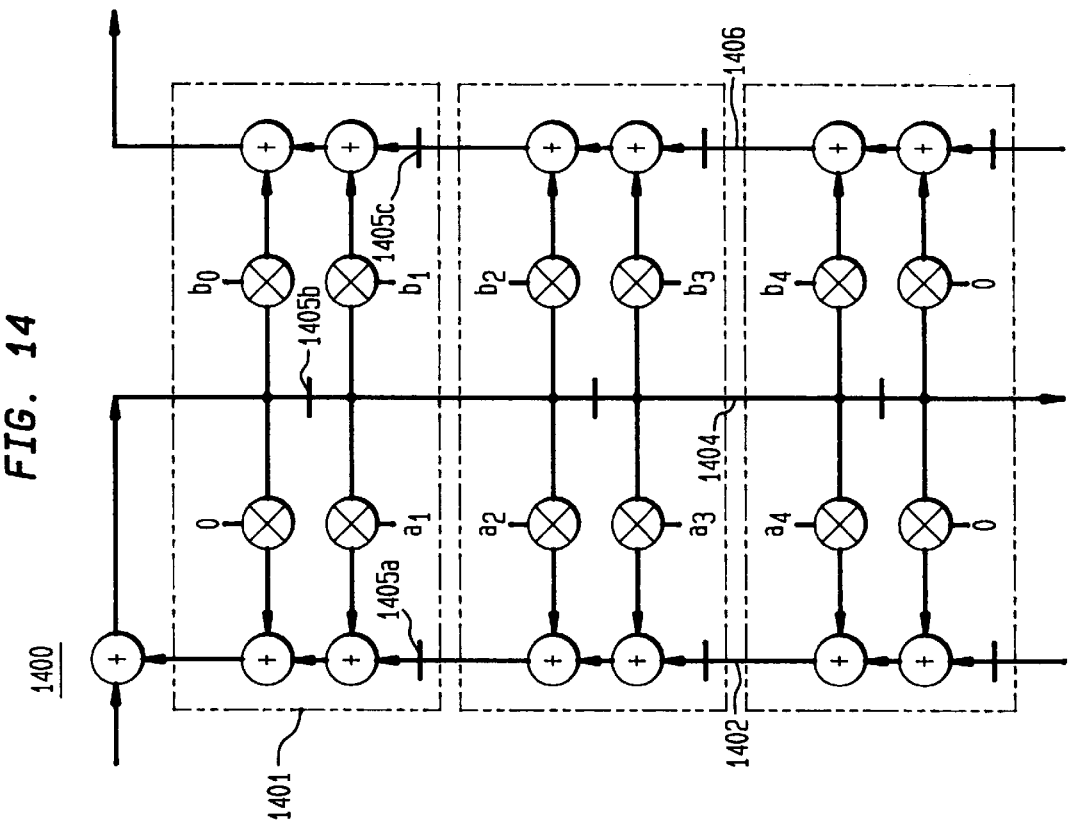
FIGS. 13 and 14 respectively illustrate two IIR filters in accordance with the invention.
Figure 13:
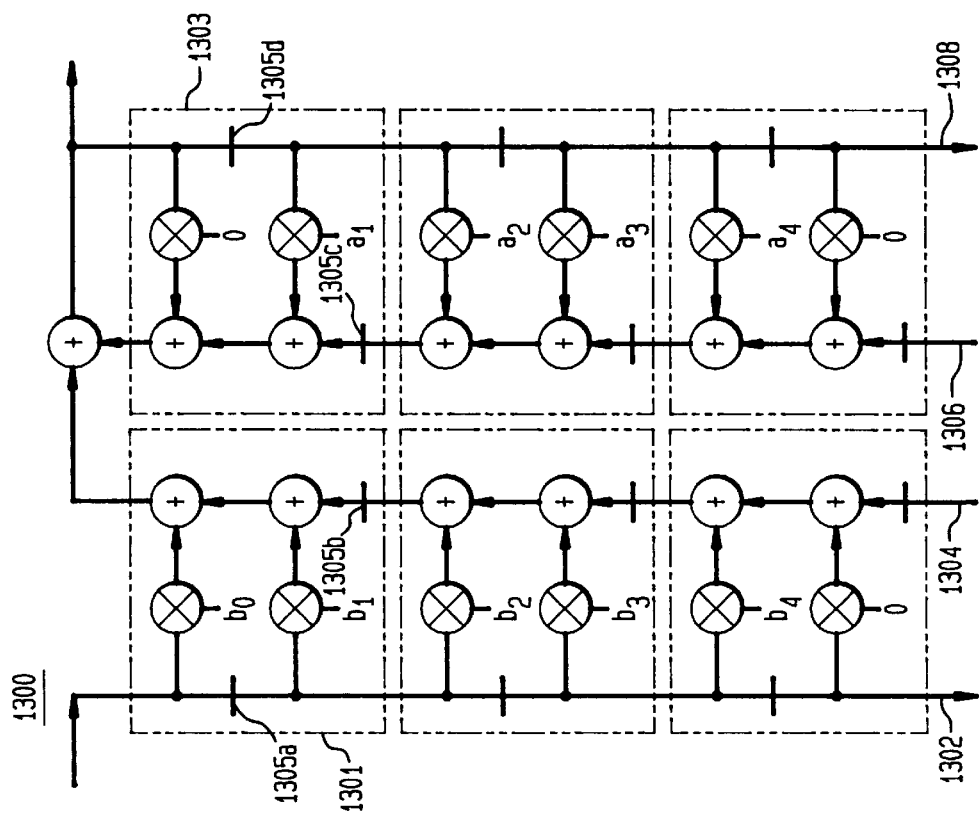

Turning to FIGS. 13 and 14, FIG. 13 illustrates IIR filter 1300 in accordance with the invention, which is an improvement over filter 1100. FIG. 14 illustrates IIR filter 1400 in accordance with the invention, which is an improvement over filter 1200. It can be shown that both filters 1300 and 1400 have the same transfer function as expression (10), and thus are functionally equivalent to filters 1100 and 1200. However, unlike filters 1100 and 1200, filters 1300 and 1400 are modular in design. Furthermore, in each module of filters 1300 and 1400 at least one delay element is disposed on each of input and output paths, in accordance with the invention. For example, in filter 1300 delay elements 1305a and 1305b in module 1301 are disposed on input path 1302 and output path 1304, respectively. In addition, delay elements 1305c and 1305d in module 1303 are disposed on output path 1306 and input path 1308, respectively. Similarly, in filter 1400 delay elements 1405a, 1405b and 1405c in module 1401 are disposed on output path 1402, input path 1404, and output path 1406, respectively.

I claim:

1. A digital filter having a predetermined number of multipliers comprising:
   a plurality of delay elements, the number of said delay elements being not greater than said predetermined number of multipliers;
   a first path for transporting input data to the filter; and
   a second path for transporting data in the filter to an output thereof, at least a first one of said plurality of delay elements being disposed on said first path, and at least a second one of said plurality of delay elements being disposed on said second path to form a plurality of identical modules which include said predetermined number of multipliers.

2. The filter of claim 1 wherein each of said delay elements comprises a shift register.

3. The filter of claim 1 further comprising a plurality of taps, each tap providing a filter weight to a respective one of said multipliers.

4. The filter of claim 3 further comprising means for updating the values of said filter weights.

5. The filter of claim 1 further comprising a plurality of adders, wherein selected ones of said adders are disposed on said second path.

6. The filter of claim 1 comprising a finite impulse response (FIR) filter.

7. The filter of claim 1 comprising an infinite impulse response (IIR) filter.

8. A digital filter having a predetermined number of multipliers comprising:
   a plurality of delay elements, the number of said delay elements being not greater than the predetermined number of multipliers; and
   first and second paths, only one of said paths transporting data to a subset of said predetermined number of multipliers, at least a first one of said delay elements being disposed on the first path and at least a second one of said delay elements being disposed on said second path to form a plurality of identical modules which include said predetermined number of multipliers.

9. The filter of claim 8 wherein each delay element comprises a shift register.

10. The filter of claim 8 wherein input data to said filter traverses said first path.

11. The filter of claim 8 wherein data in the filter traverses said second path to an output of said filter.

12. The filter of claim 8 comprising an FIR filter.

13. The filter of claim 8 comprising an IIR filter.

14. A digital filter performing a predetermined transfer function on data input thereto, the filter comprising:
   a filter section responsive to the data for generating an output in accordance with the predetermined transfer function:
   the filter section further comprising:
   a plurality of modules and
   at least a first path and a second path connecting said plurality of modules in series relation, the first path providing said output;
   each module further comprising:
   a plurality of multipliers, the second path transporting the data to a subset of said plurality of multipliers; and
   a plurality of delay elements, the number of said delay elements being not greater than the number of said multipliers, at least a first one of said delay elements being disposed on said first path, and at least a second one of said delay elements being disposed on said second path.

15. The filter of claim 14 wherein each delay element comprises a shift register.

16. The filter of claim 14 wherein only one of said delay elements in the module is disposed on said second path.

17. The filter of claim 14 wherein each module further comprises a plurality of adders, at least one of said adders in the module being disposed on said first path.

18. The filter of claim 14 wherein only one of said delay elements in the module is disposed on said first path.

19. The filter of claim 14 comprising an FIR filter.
20. The filter of claim 14 comprising an IIR filter.
21. An adaptive digital filter comprising:

a filter section having a plurality of filter weights; and an update section for updating the values of said filter weights, said update section further comprising:

a plurality of multipliers;

first and second paths, each multiplier in said update section being connected to both of the first and second paths; and a plurality of delay elements, at least a first one of said delay elements being disposed on said first path and between a first pair of said multipliers, and at least a second one of said delay elements being disposed on said second path and between a second pair of said multipliers.

22. The filter of claim 21 wherein said filter section comprises:

a second set of multipliers;

a second group of delay elements, the number of said delay elements in the second group being not greater than the number of said multipliers in the second set; and third and fourth paths, at least one of said third and fourth paths being connected to each of said multipliers in the second set, at least one of said delay elements in the second group being disposed on the third path, and at least another one of said delay elements in the second group being disposed on said fourth path.

23. The filter of claim 22 wherein input data to said filter section traverses said third path.

24. The filter of claim 23 wherein said third path is connected to each of said multipliers in said second set.

25. The filter of claim 22 wherein data in said filter section traverses said fourth path to an output of said filter section.

26. The filter of claim 21 wherein said update section updates the values of said filter weights in accordance with a steepest descent algorithm.

* * * * *